United States Patent
Zhang et al.

(10) Patent No.: US 12,164,716 B2
(45) Date of Patent: Dec. 10, 2024

(54) DISPLAY PANEL AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Guiyu Zhang, Beijing (CN); Hongqiang Luo, Beijing (CN); Yichen Jiang, Beijing (CN); Lixiang Yi, Beijing (CN); Yuanyuan Chai, Beijing (CN); Hang Min, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 67 days.

(21) Appl. No.: 17/789,188

(22) PCT Filed: Aug. 16, 2021

(86) PCT No.: PCT/CN2021/112691
§ 371 (c)(1),
(2) Date: Jun. 25, 2022

(87) PCT Pub. No.: WO2022/057541
PCT Pub. Date: Mar. 24, 2022

(65) Prior Publication Data
US 2023/0061413 A1    Mar. 2, 2023

(30) Foreign Application Priority Data

Sep. 16, 2020   (CN) .......................... 202010973427.5

(51) Int. Cl.
*G06F 3/044* (2006.01)
*G06F 3/041* (2006.01)
(Continued)

(52) U.S. Cl.
CPC .......... *G06F 3/0412* (2013.01); *G06F 3/0416* (2013.01); *G06F 3/04164* (2019.05);
(Continued)

(58) Field of Classification Search
CPC .. G06F 3/0412; G06F 3/0416; G06F 3/04164; G06F 3/0443; G06F 3/0445;
(Continued)

(56) References Cited

U.S. PATENT DOCUMENTS

2016/0266677 A1   9/2016   Liu et al.
2017/0153731 A1*  6/2017   Liu ....................... G06F 3/0443

FOREIGN PATENT DOCUMENTS

CN    104793803 A    7/2015
CN    204731755 U    10/2015
(Continued)

*Primary Examiner* — Julie Anne Watko
(74) *Attorney, Agent, or Firm* — HOUTTEMAN LAW LLC

(57) ABSTRACT

Embodiments of the present disclosure provide a display panel, including a display substrate (1); and a touch electrode (2) and a shielding electrode (6) arranged on the display substrate (1); where the shielding electrode (6) and the touch electrode (2) are sequentially arranged in a direction away from the display substrate (1); and an orthographic projection of the shielding electrode (6) on the display substrate (1) at least partially overlaps an orthographic projection of the touch electrode (2) on the display substrate (1), the shielding electrode comprises shielding units arranged in an array, in a row direction of the array, M shielding units each having a load value x are provided, $M*x \leq P$; and in a column direction of the array, N shielding units each having a load value y are provided, $N*y \leq P$; P is a maximum load capacity of a driver chip for providing signals for the shielding electrode.

18 Claims, 9 Drawing Sheets

(51) Int. Cl.
    *H10K 59/126*     (2023.01)
    *H10K 59/40*     (2023.01)

(52) U.S. Cl.
    CPC .......... *G06F 3/0443* (2019.05); *G06F 3/0446* (2019.05); *H10K 59/126* (2023.02); *H10K 59/40* (2023.02); *G06F 2203/04103* (2013.01); *G06F 2203/04107* (2013.01)

(58) Field of Classification Search
    CPC ......... G06F 3/0446; G06F 2203/04103; G06F 2203/04107; H10K 59/126; H10K 29/40
    See application file for complete search history.

(56) References Cited

FOREIGN PATENT DOCUMENTS

| | | |
|---|---|---|
| CN | 106932942 A | 7/2017 |
| CN | 112114707 A | 12/2020 |

\* cited by examiner

DISPLAY PANEL AND DISPLAY APPARATUS

TECHNICAL FIELD

Embodiments of the present disclosure belong to the field of display technology, and in particular relates to a display panel, a method for driving a display panel, a method for manufacturing a display panel, and a display apparatus.

BACKGROUND

Current flexible organic light-emitting diode (OLED, also called organic electroluminescence display) touch products substantially may be classified into an out-cell type and an on-cell type. In an out-cell touch product, a touch film layer is provided far away from a cathode of a display device, and thus display noises have a relatively small effect on touch operations. Therefore, an out-cell structure is applicable to wearable devices, mobile phones, tablets, foldable products, notebooks and the like, and meanwhile, can be supported by corresponding touch chips at present. However, the out-cell structure, due to a thickness thereof, cannot make full use of advantages of the OLED, and cannot satisfy requirements for structures of foldable products. Therefore, OLED products of an on-cell structure emerge.

SUMMARY

Embodiments of the present disclosure provide a display panel, a method for driving a display panel, a method for manufacturing a display panel, and a display apparatus.

In a first aspect, an embodiment of the present disclosure provides a display panel, including a display substrate; and
a touch electrode and a shielding electrode arranged on the display substrate; where the shielding electrode and the touch electrode are sequentially arranged in a direction away from the display substrate; and
an orthographic projection of the shielding electrode on the display substrate at least partially overlaps an orthographic projection of the touch electrode on the display substrate.

In some implementations, the shielding electrode includes a plurality of shielding units spaced apart from each other.

In some implementations, the plurality of shielding units are arranged in an array;
the touch electrode includes a plurality of touch units arranged in an array; and
in a row and/or column direction of the array of touch units, the shielding units correspond to the touch units in a one-to-one manner or in a one-to-many manner.

In some implementations, in a row direction of the array of shielding units, M shielding units are provided, each of the shielding units has a load value x, and $M*x \leq P$; and
in a column direction of the array of shielding units, N shielding units are provided, each of the shielding units has a load value y, and $N*y \leq P$;
where P is a maximum load capacity of a driver chip for providing signals for the shielding electrode.

In some implementations, the display panel further includes shielding signal lines arranged in the same layer as the shielding electrode; where
each of the shielding units is individually connected to one of the shielding signal lines, and the shielding signal lines connected to one or more rows of shielding units are connected together to be connected into the driver chip.

In some implementations, the shielding signal lines include a first signal line and second signal lines, the first signal line surrounds a periphery of the array of shielding units, a part of the second signal lines are distributed at the periphery of the array of shielding units, and another part of the second signal lines are distributed in spaces between rows of the array of shielding units; and
the second signal lines are respectively and independently connected to the shielding units, and connected to the first signal line, and the first signal line is connected to the driver chip.

In some implementations, the shielding electrode and the touch electrode are configured to input a same signal during touching.

In some implementations, the display substrate includes a plurality of sub-pixels arranged in an array; and
the shielding units are in a grid shape, and an orthographic projection of the shielding units on the display substrate does not overlap the sub-pixels; and an orthographic projection of the shielding signal lines on the display substrate does not overlap the sub-pixels.

In some implementations, the touch units are in a grid shape, and an orthographic projection of the touch units on the display substrate does not overlap the sub-pixels; and
a grid density of the shielding units is smaller than or equal to a grid density of the touch units; and a grid density of the touch units is smaller than a distribution density of the sub-pixels.

In some implementations, the display panel further includes touch signal lines on a side of the shielding electrode away from the display substrate, and on a side of the touch electrode close to the display substrate; where
each of the touch units is individually connected to one of the touch signal lines; and an orthographic projection of the touch signal lines on the display substrate overlaps an orthographic projection of the touch electrode on the display substrate.

In some implementations, the display panel further includes a first insulation layer between the touch signal lines and the touch electrode; where
at least one first via is opened in the first insulation layer in a region corresponding to each of the touch units, and the touch unit is connected to the touch signal line, which is configured to provide signals for the touch unit, through the first via.

In some implementations, a plurality of first vias are opened in the first insulation layer in a region corresponding to each of the touch units; where
the plurality of first vias are uniformly distributed and connected to each other through the touch signal lines.

In some implementations, one first via is opened in the first insulation layer in a region corresponding to each of the touch units; where
for a column of touch units, from top to bottom, and first vias corresponding to the touch units are sequentially arranged from an upper right corner of the touch units to a lower left corner of the touch units.

In some implementations, in a row direction of the array of touch units, A touch units are provided, each of the touch units has a load value a, and $A*a \leq P$; and
in a column direction of the array of touch units, B touch units are provided, each of the touch units has a load value b, and $B*b \leq P$;
where P is a maximum load capacity of a touch driver chip for providing signals for the touch electrode.

In some implementations, the display panel further includes floating electrodes floating and disposed in the same layer as the touch electrode, an orthographic projection of the floating electrodes on the display substrate does not overlap an orthographic projection of the touch electrode on the display substrate.

In some implementations, the floating electrodes are in a grid shape, and an orthographic projection of the floating electrodes on the display substrate does not overlap the sub-pixels.

In some implementations, the floating electrodes are distributed in a region, where the touch units are located, with a ratio of distribution area less than 40%.

In a second aspect, an embodiment of the present disclosure further provides a display apparatus including the display panel as described above.

In a third aspect, an embodiment of the present disclosure further provides a method for manufacturing a display panel, including: preparing a display substrate; and sequentially preparing a shielding electrode and a touch electrode on a display side of the display substrate; where an orthographic projection of the shielding electrode on the display substrate at least partially overlaps an orthographic projection of the touch electrode on the display substrate.

In a fourth aspect, an embodiment of the present disclosure further provides a method for driving a display panel, the display panel includes a display substrate, and a touch electrode and a shielding electrode arranged on a display side of the display substrate; where the shielding electrode and the touch electrode are sequentially arranged in a direction away from the display substrate; and an orthographic projection of the shielding electrode on the display substrate at least partially overlaps an orthographic projection of the touch electrode on the display substrate; and the method includes: providing a touch driving signal to the touch electrode, and keeping the shielding electrode floating; or, providing the same signal as the touch driving signal to the shielding electrode.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art through detailed description of the exemplary embodiments with reference to the accompanying drawings.

REFERENCE SIGNS

Figure 1:
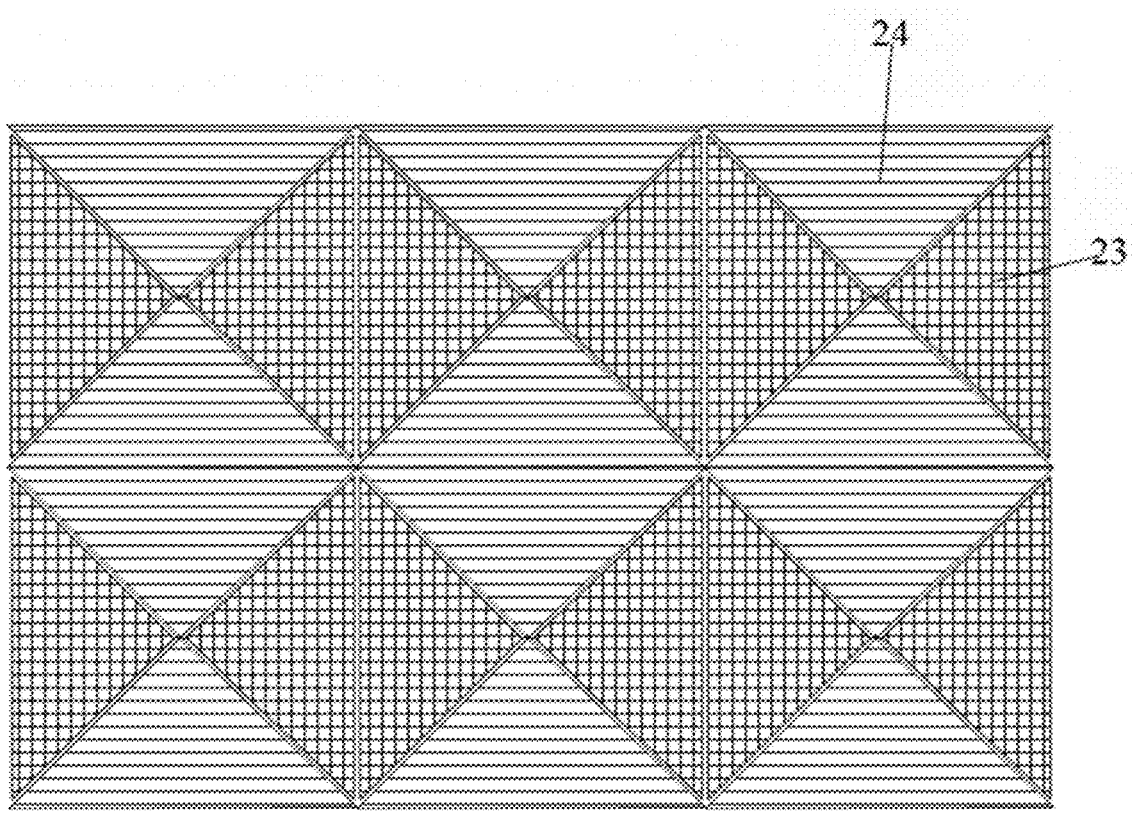
FIG. 1 is a schematic top view of a touch structure based on a mutual-capacitance touch principle in the existing art.

1. display substrate; 10. sub-pixel; 101. display region; 102. bonding region; 2. touch electrode; 21. touch unit; 3. touch signal line; 4. first insulation layer; 5. first via; 6. shielding electrode; 61. shielding unit; 7. second insulation layer; 8. shielding signal line; 81. first signal line; 82. second signal line; 9. lead electrode; 11. touch electrode bonding end; 12. shielding electrode bonding end; 13. second via; 14. third via; 15. fourth via; 16. peripheral circuit; 17. floating electrode; 18. selection switch circuit; 19. polarizer; 20. cover plate; 22. third insulation layer; 23. driving electrode; 24. sensing electrode; 25. touch electrode pattern; 26. touch electrode wire; and 27. rectangular region.

DETAIL DESCRIPTION OF EMBODIMENTS

In order to make those skilled in the art better understand the technical solutions in the embodiments of the present disclosure, the display panel, the method for driving the display panel, the method for manufacturing the display panel, and the display apparatus provided in the embodiments of the present disclosure will be described in further detail below with reference to the accompanying drawings and specific implementations.

Embodiments of the present disclosure will be described more sufficiently below with reference to the accompanying drawings, but they may be embodied in different forms and should not be construed as limited to the embodiments set forth in the present disclosure. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

In the disclosed technology, in a small-sized OLED product of an on-cell touch structure, a touch electrode is directly formed on a display substrate formed thereon with a prepared OLED display structure. In the small-sized OLED product, display noises of the display substrate will be coupled to the touch electrode and a touch signal line for providing a touch driving signal for the touch electrode, causing strong interference on touch control of the touch electrode and thus reducing touch performance of the touch electrode.

For a large-sized touch OLED product, an influence of a coupling effect of display noises on the touch performance of the touch electrode will become more obvious, thereby severely affecting the touch performance of the touch electrode.

In addition, the small-sized OLED product of an on-cell touch structure typically adopts a scheme of touch structure with a multilayer touch electrode design based on a mutual-capacitance touch principle. As shown in FIG. 1, the touch structure is formed by an array of touch units, in which the touch units include driving electrodes 23 and sensing electrodes 24. The driving electrodes 23, arranged in a row direction in the touch structure, are connected electrically through bridges, the sensing electrodes 24, arranged in a column direction in the touch structure, are connected electrically, and the driving electrodes 23 in the row direction are insulated from the sensing electrodes 24 in the column direction at intersections at which the driving electrodes 23 intersect with the sensing electrode 24, to achieve a touch function. Both the driving electrodes 23 and the sensing electrodes 24 have hollow-out regions in which floating electrodes are provided. The hollow-out regions can help to reduce load values of the driving electrodes 23 and the sensing electrodes 24. According to a simulation result of the mutual-capacitance touch structure, each touch unit has a load of about 15 pF, and by evaluating for a mobile phone with a conventional size, a total load of the touch structure (excluding wires) is about 600 pF, and since an extreme load driving capacity of a current touch driver chip is about 1000 pF, the requirement for driving a small-sized touch-control product is substantially satisfied. If such scheme is to be applied to a large-sized touch OLED product, by evaluating for a laptop product with a conventional size, i.e., 15.6 inches, it is predicted that the touch structure would have a total load of about 1260 pF, and if an influence of wires is considered, the total load of the touch structure will become greater than 1500 pF, which far exceeds the load driving capacity of the touch driver chip, and may lead to a situation where no touch driver chip is available.

Figure 2:
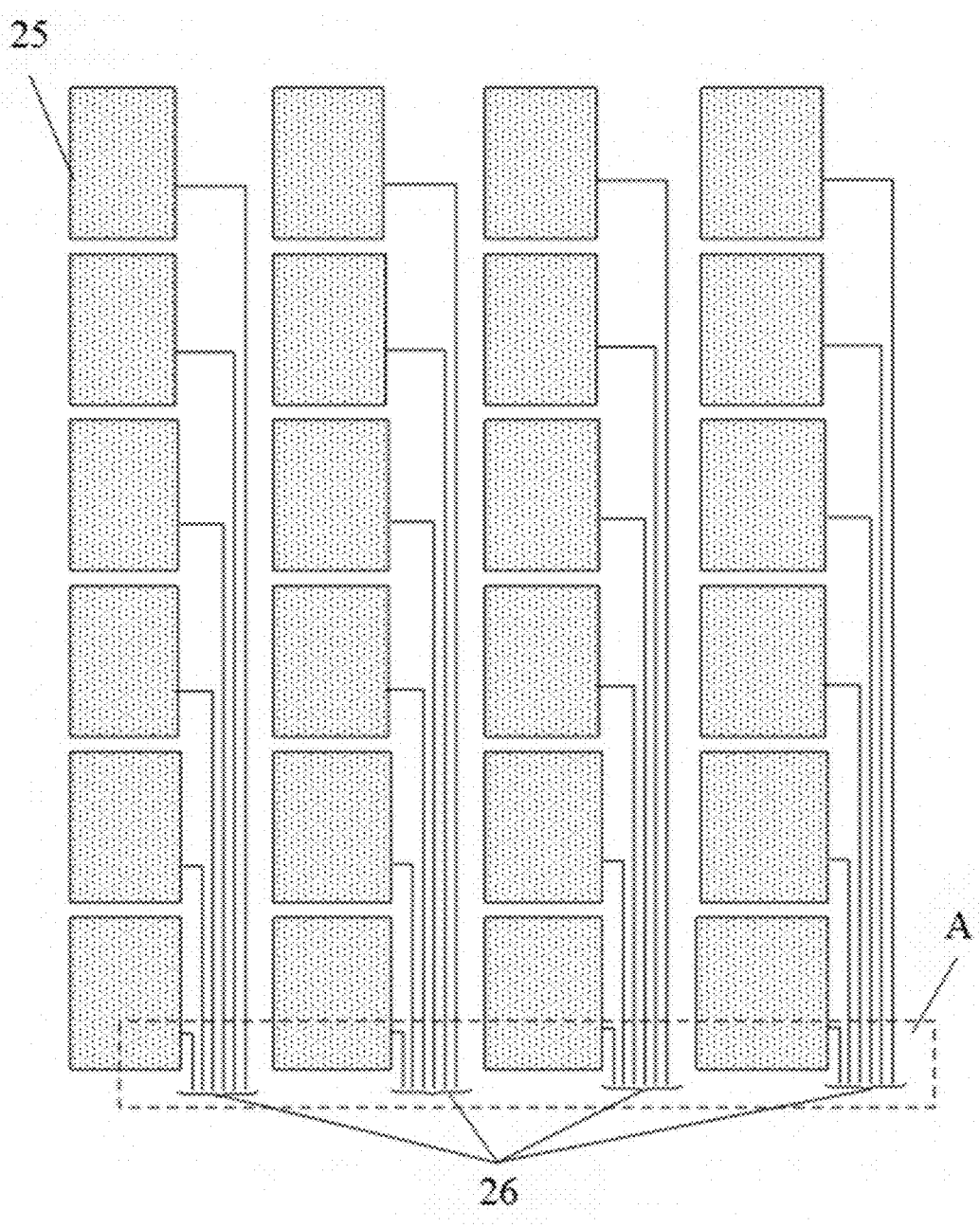
FIG. 2 is a schematic top view of a touch structure based on a self-capacitance touch principle in the existing art.

The small-sized OLED product of an on-cell touch structure may also adopt another scheme of touch structure with a single-layer touch electrode design based on a self-capacitance touch principle. As shown in FIG. 2, the touch structure is formed by an array of touch units, in which each touch unit is formed by a touch electrode pattern 25 and a touch electrode wire 26. The touch electrode pattern 25 and the touch electrode wire 26 are located in a same layer, belonging to a single-layer touch electrode design scheme. A main reason for adopting the single-layer touch electrode design scheme is that the touch electrode pattern 25 in each touch unit has a relatively small area, so that the load of the whole touch structure is relatively small (generally less than 50 pF), and even if the influence of the touch electrode wire 26 is considered, the load of the whole touch structure can be controlled within about 100 pF, and almost all current touch driver chips can satisfy the requirement for driving the touch structure. Although the touch structure with the single-layer touch electrode design based on the self-capacitance touch principle has a far smaller load than the touch structure with a multilayer touch electrode design based on the mutual-capacitance touch principle, and thus can be matched with almost all current touch driver chips, the defect of the touch structure with the single-layer touch electrode design based on the self-capacitance touch principle is also very obvious, because in the touch structure with the single-layer touch electrode design based on the self-capacitance touch principle, touch electrode wires 26 are distributed widely between touch electrode patterns 25, and especially at an end (as shown by part A in FIG. 2) of an arrangement of the touch electrode patterns 25, the touch electrode wires 26 occupy a greater width. Since the touch electrode wires 26 cannot achieve positioning, the greater the width occupied by the touch electrode wires 26 is, the worse the touch performance is, the touch performance is specifically reflected in linearity and accuracy of touch control, that is, the usually called blind region is generated. Theoretically, it is desired to eliminate an influence of the blind region on touch operations.

In addition, since, in the touch structure with the single-layer touch electrode design based on the self-capacitance touch principle, each touch unit is connected to one touch electrode line, many leading-out ends of touch electrode lines will appear at an end of a screen, which means that a very large bonding region will be resulted in, leading to an increased area of a peripheral circuit to be bonded, as well as an increased cost.

If the touch structure with the single-layer touch electrode design based on the self-capacitance touch principle is applied to a large-sized OLED product, on one hand, more leading-out ends of touch electrode lines will appear at the end of the screen, and the bonding region will become larger; and on the other hand, the blind region will be larger, and the touch performance of the product will become worse.

In summary, the scheme of touch structure with the multilayer touch electrode design based on the mutual-capacitance touch principle, and the scheme of touch structure with the single-layer touch electrode design based on the self-capacitance touch principle, which are applied to small-sized OLED products, cannot be applied to large-sized OLED products at all. Therefore, it is desired to design a touch structure suitable for a large-sized OLED product.

Figure 3:
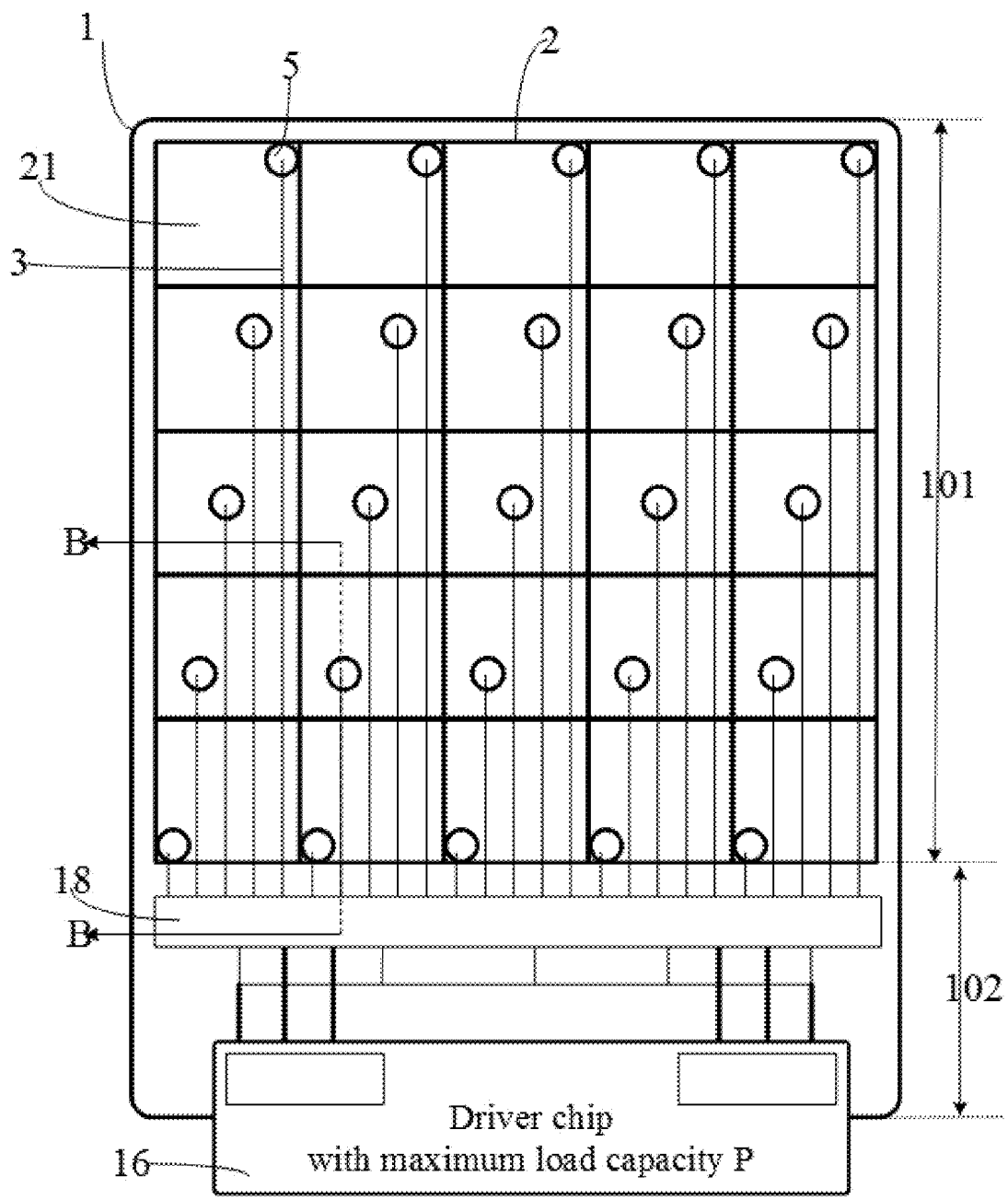
FIG. 3 is a schematic top view showing an arrangement of a touch electrode and touch signal lines in the display panel according to an embodiment of the present disclosure.
Figure 4:
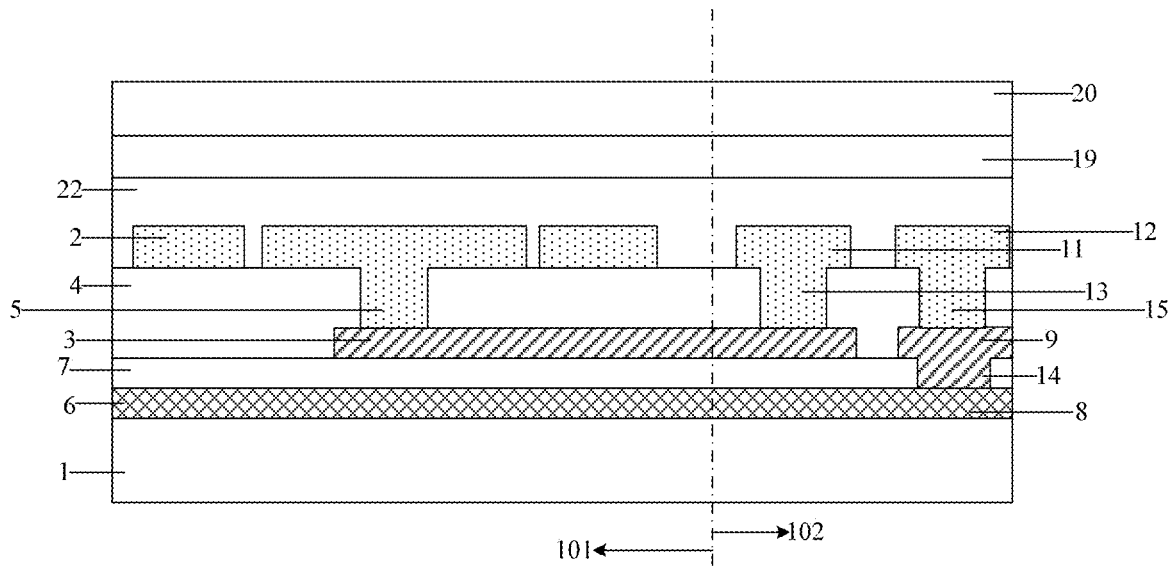
FIG. 4 is a schematic structural sectional view of the display panel in FIG. 3 taken along line BB.

Based on the above technical problems of the OLED touch products, an embodiment of the present disclosure provides a display panel which, as shown in FIGS. 3 and 4, includes a display substrate 1; and a touch electrode 2 and a shielding electrode 6 arranged on the display substrate 1. The shielding electrode 6 and the touch electrode 2 are sequentially arranged in a direction away from the display substrate 1; and an orthographic projection of the shielding electrode 6 on the display substrate 1 at least partially overlaps an orthographic projection of the touch electrode 2 on the display substrate 1.

The display substrate 1 includes a driving backplane, a light-emitting element arranged on the driving backplane, and a package layer configured to package the light-emitting element. The light-emitting element may be an organic electroluminescent element (e.g., an OLED). Certainly, the light-emitting element may be any other light-emitting element, such as an LED or the like.

By providing the shielding electrode 6 between the display substrate 1 and the touch electrode 2, display noises of the display substrate 1 can be shielded, thereby reducing and avoiding interference of coupling effect of the display noises on touch operations of the touch electrode 2, and thus improving the touch performance of the display panel.

Figure 5:
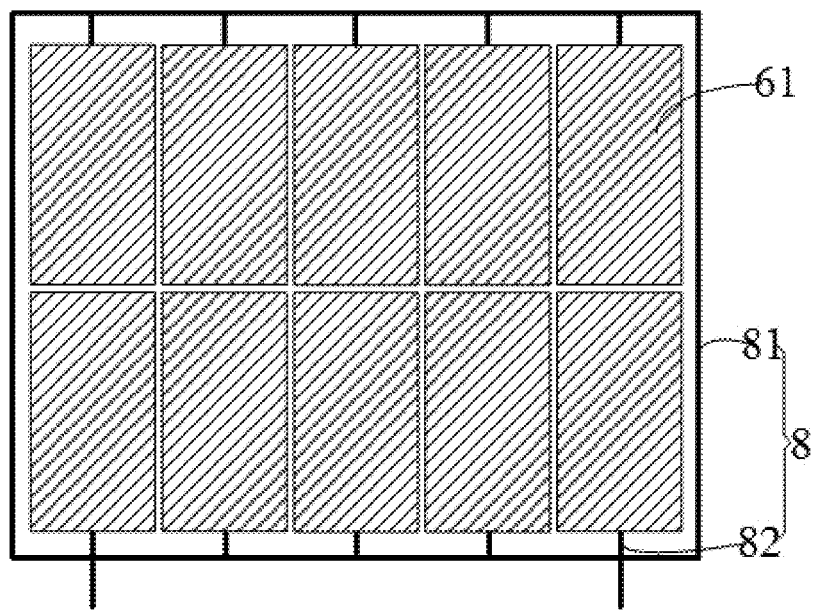
FIG. 5 is a schematic top view showing a structural arrangement of a shielding electrode and shielding signal lines in a display panel according to an embodiment of the present disclosure.

In some implementations, as shown in FIG. 5, the shielding electrode 6 includes a plurality of shielding units 61 spaced apart from each other. In some implementations, the shielding electrode 6 and the touch electrode 2 are configured to input a same signal during touching. By dividing the shielding electrode 6 into a plurality of shielding units 61 spaced apart from each other, partition of the whole shielding electrode 6 is implemented, and with such partition, a load value of the shielding unit 61 is smaller than a load value of the whole shielding electrode 6, thereby ensuring that when signals are input to the shielding units 61, a load value of the plurality of shielding units 61 do not exceed a maximum load capacity of the driver chip for providing signals for the shielding units, and thus further satisfying the requirement for driving the shielding electrode 6 by the driver chip.

Figure 6:
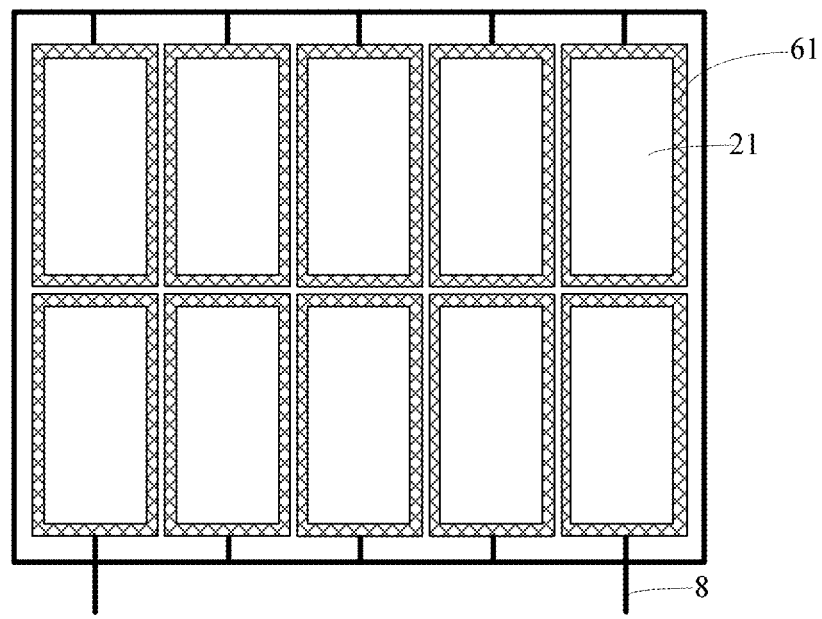
FIG. 6 is a schematic top view showing shielding units corresponding to touch units in one to one manner in a display panel according to an embodiment of the present disclosure.

In some implementations, as shown in FIG. 6, the plurality of shielding units 61 are arranged in an array; the touch electrode 2 includes a plurality of touch units 21 arranged in an array; and in a row direction and a column direction of the array of touch units 21, the shielding units 61 and the touch units 21 are distributed in a one-to-one correspondence manner, that is, the shielding units 61 correspond to the touch units 21 in one to one manner in the row direction and the column direction of the array of touch units 21. The row direction and the column direction of the array of touch units 21 are not limited to be perpendicular to each other, and an angle formed by the row direction intersecting with the column direction may be any acute angle smaller than 90°.

In some implementations, the shielding units and the touch units are distributed in one-to-one correspondence manner merely in the row direction or the column direction of the array of touch units.

Figure 7:
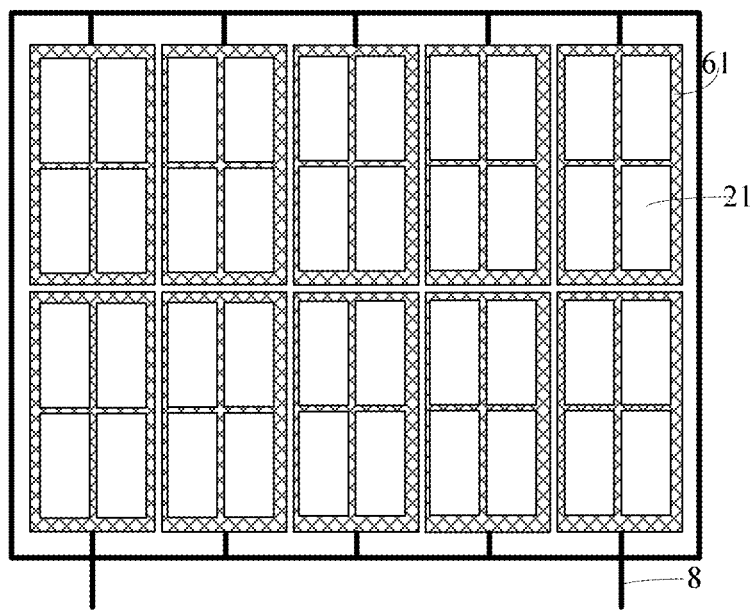
FIG. 7 is a schematic top view showing shielding units corresponding to touch units in one to many manner in a display panel according to an embodiment of the present disclosure.

In some implementations, as shown in FIG. 7, in a row direction and a column direction of the array of touch units 21, the shielding units 61 and the touch units 21 are distributed in a one-to-many correspondence manner, that is, the shielding units 61 correspond to the touch units 21 in one to many manner in the row direction or the column direction of the array of touch units 21.

In some implementations, the shielding units and the touch units are distributed in one-to-many correspondence manner merely in the row direction or column direction of the array of touch units.

In some implementations, in a row direction of the array of shielding units 61, M shielding units 61 are provided, each of the shielding units 61 has a load value x, and $M*x \leq P$; and in a column direction of the array of shielding units 61, N shielding units 61 are provided, each of the shielding units 61 has a load value y, and $N*y \leq P$; where P is a maximum load capacity of a driver chip for providing signals for the shielding electrode 6. The same signal as that input to the touch units 21 is input to the shielding units 61 during touch control. Due to arrangement of the above structure of the shielding electrode 6, on one hand, display noises of the display substrate can be shielded so that the display noises are prevented from being coupled to the touch electrode, thereby avoiding interference of the display noises on the touch performance of the touch electrode; and on the other hand, since the shielding units 61 and the touch units 21 have the same signal and there is no voltage difference therebetween, the capacitor formed by the shielding units 61 and the touch units 21 are not to be charged, so that the touch units 21 have the minimum capacitive load and thus have the least requirement on the touch driver chip. In addition, the above partition of the shielding electrode 6 can ensure that neither a load value of each row of shielding units 61 nor a load value of each column of shielding units 61 exceeds the maximum load capacity of the touch driver chip, thereby satisfying the requirement for driving the shielding electrode 6 by the touch driver chip.

In some implementations, as shown in FIG. 5, the display panel further includes shielding signal lines 8 arranged in the same layer as the shielding electrode 6. Each of the shielding units 61 is individually connected to one of the shielding signal lines 8, and the shielding signal lines 8 connected to one or more rows of shielding units 61 are connected together to be connected into the driver chip. With such arrangement, parallel connection of the shielding units 61 is achieved, it is ensured that during touch control, the driver chip provides signals with the same magnitude as that of the touch driving signal to the shielding units 61, so that the touch units 21 have the minimum capacitive load and thus the least requirement on the touch driver chip. Meanwhile, the shielding units 61 can better shield the display noises of the display substrate, so that the display noises of the display substrate are prevented from being coupled to the touch electrode, thereby avoiding interference of the display noises on the touch performance of the touch electrode.

In some implementations, as shown in FIG. 5, the shielding signal lines 8 include a first signal line 81 and second signal lines 82. The first signal line 81 surrounds a periphery of the array of shielding units 61, while a part of the second signal lines 82 are distributed at the periphery of the array of shielding units 61, and another part of the second signal lines 82 are distributed in spaces between rows of the array of shielding units 61. The second signal lines 82 are respectively and independently connected to the shielding units 61, and connected to the first signal line 81, while the first signal line 81 is connected to the driver chip. The first signal line 81 may be connected to the driver chip at one end or both ends thereof. With such arrangement, parallel connection of the shielding units 61 is achieved, it is ensured that neither a load value of each row of shielding units 61 nor a load value of each column of shielding units 61 exceeds the maximum load capacity of the touch driver chip, thereby satisfying the requirement for driving the shielding electrode 6 by the touch driver chip.

Figure 8:
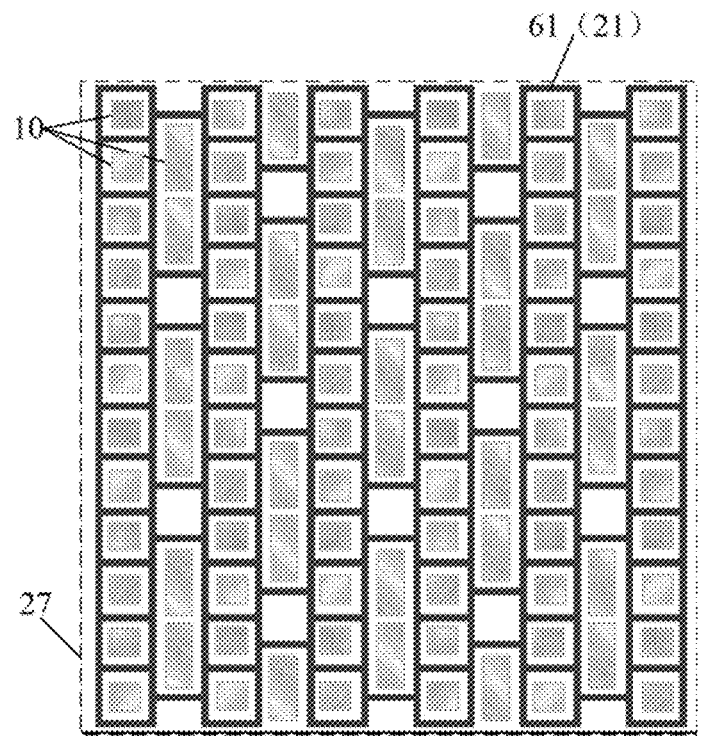
FIG. 8 is a schematic structural top view showing an arrangement of touch units and sub-pixels in a display panel according to an embodiment of the present disclosure.

In some implementations, as shown in FIG. 8, the display substrate includes a plurality of sub-pixels 10 arranged in an array; the shielding units 61 are in a grid shape, and an orthographic projection of the shielding units 61 on the display substrate does not overlap the sub-pixels 10; and an orthographic projection of the shielding signal lines on the display substrate does not overlap the sub-pixels 10. With such arrangement, on one hand, the load value of the shielding electrode 6 can be reduced while the shielding electrode 6 shields display noises of the display substrate, so that the driver chip can better drive the shielding electrode 6, and sensitivity, linearity and accuracy of touch control are improved; and on the other hand, the provision of the shielding electrode 6 will not affect normal light emission of the display panel, thereby ensuring the light transmittance of the display panel, and ensuring normal display of the display panel.

In some implementations, the display substrate further includes a driving backplane in which a pixel circuit is provided. The pixel circuit may be a 2T1C pixel circuit, a 7T1C pixel circuit, or any other pixel circuit. The sub-pixels 10 are disposed on the driving backplane and connected to the pixel circuit in the driving backplane. The sub-pixels 10 includes red, green and blue sub-pixels, and is an organic electroluminescent light-emitting element (e.g., OLED). The OLED includes an anode, a light-emitting functional layer and a cathode which are sequentially disposed on the driving backplane. The light-emitting functional layer includes a hole transport layer, a hole injection layer, a light-emitting layer, an electron injection layer and an electron transport layer which are sequentially superimposed on each other.

In some implementations, as shown in FIG. 8, the touch units 21 are in a grid shape, and an orthographic projection of the touch units 21 on the display substrate does not overlap the sub-pixels 10. With such arrangement, on one hand, the load value of the touch electrode can be reduced, so that the touch driver chip can better drive the touch electrode, and the linearity and the accuracy of touch control are improved; and on the other hand, the provision of the touch electrode will not affect normal light emission of the display panel, thereby ensuring the light transmittance of the display panel, and ensuring normal display of the display panel. Meanwhile, since the orthographic projection of the touch units 21 on the display substrate does not overlap the sub-pixels 10, moire fringes can be avoided, and the display effect of the display panel is improved.

In some implementations, the touch units may be planar. For example, the touch units are made of a transparent ITO material, as long as it is ensured that the load of the touch units satisfies the requirement for driving the touch driver chip.

In some implementations, as shown in FIGS. 8 and 9a to 9c, a grid density (i.e., a density of grid units) of the shielding units 61 is smaller than or equal to a grid density of the touch units 21; and the grid density of the touch units 21 is smaller than a distribution density of the sub-pixels 10. The grid density of the touch units 21 refers to a density of the touch units 21 in a grid shape in a region (e.g., a rectangular region 27) where the touch units 21 are located. The grid density of the shielding units 61 refers to a density of the shielding units 61 in a grid shape in a region (e.g., the rectangular region 27) where the shielding units 61 are located. The distribution density of the sub-pixels 10 refers to a density of the sub-pixels 10 in a region where the touch units 21 are located. Since the load value of the single shielding unit 61 is related to the grid density of the shielding units, the greater the grid density is, the greater the load value of the shielding unit 61 is; and the smaller the grid density is, the smaller the load value of the shielding unit 61 is. Therefore, by setting the grid density of the shielding units 61, on one hand, the load value of the shielding electrode 6 can be reduced while the shielding electrode 6 shields display noises of the display substrate, so that the driver chip can better drive the shielding electrode 6, and sensitivity, linearity and accuracy of touch control are improved; and on the other hand, the provision of the shielding electrode 6 will not affect normal light emission of the display panel, thereby ensuring the light transmittance of the display panel, and ensuring normal display of the display panel.

Figure 9A:
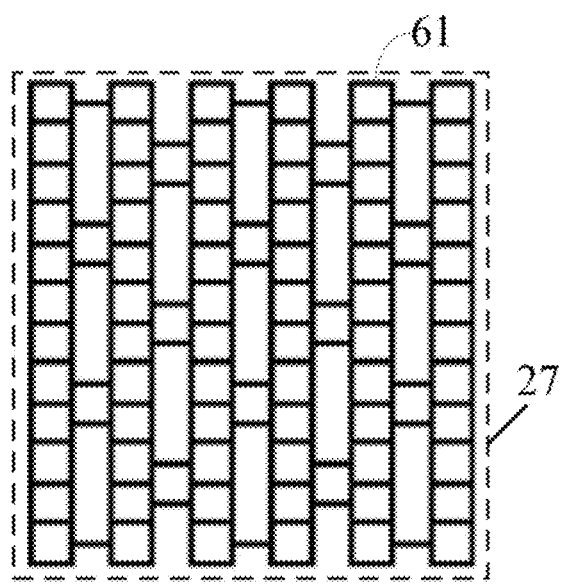
FIG. 9*a* is a schematic structural top view of shielding units having a same grid density as the touch units.
Figure 9B:
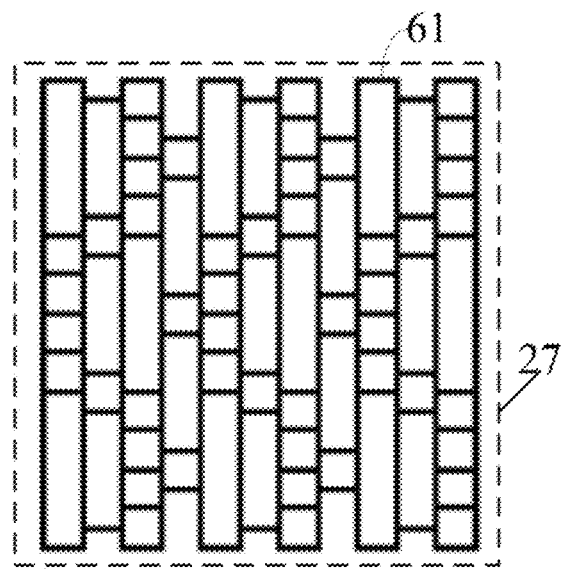
FIG. 9*b* is a schematic structural top view of shielding units having a grid density being 75% of the grid density of the touch units.
Figure 9C:
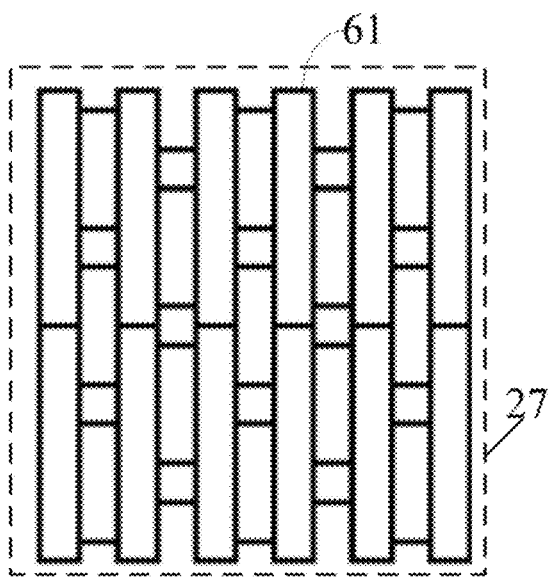
FIG. 9*c* is a schematic structural top view of shielding units having a grid density being 50% of the grid density of the touch units.

In some implementations, as shown in FIGS. 9a to 9c, the grid density of the shielding units 61 may be set to be the same as the grid density of the touch units 21, or to be 75% of the grid density of the touch units 21, or to be 50% of the grid density of the touch units 21.

In some implementations, as shown in FIGS. 3 and 4, the display panel further includes touch signal lines 3 arranged on a side of the shielding electrode 6 away from the display substrate 1, and on a side of the touch electrode 2 close to the display substrate 1. A second insulation layer 7 is provided between the shielding electrode 6 and the touch signal lines 3. Each of the touch units 21 is individually connected to one of the touch signal lines 3; and an orthographic projection of the touch signal lines 3 on the display substrate 1 overlaps an orthographic projection of the touch electrode 2 on the display substrate 1. The touch signal lines 3 can transmit touch driving signals from the touch driver chip to the touch units 21. With such arrangement, mutual-capacitance touch control of the touch electrode 2 can be implemented. That is, a capacitor is formed by the touch units 21 and the ground, and when a finger touches the display panel, a capacitor formed by the finger will be added to the capacitor formed by the touch units 21 and the ground, so that the capacitance between the touch units 21 and the ground is increased, that is, the touch electrode 2 in the embodiment of the present disclosure enables self-capacitance touch control on the display panel. During touch detection, the touch units 21 in horizontal and vertical in the array of touch units 21 are sequentially detected, and a horizontal coordinate and a vertical coordinate of the touch control are determined according to a capacitance change of the touch units 21 before and after the touch control, and then combined into a planar touch coordinate. The self-capacitance touch detection mode is equivalent to projecting a touch point on a touch screen to the X-axis direction and the Y-axis direction respectively, then calculating coordinates in the X-axis direction and the Y-axis direction respectively, and finally combining the coordinates into a coordinate of the touch point.

In some implementations, by providing the touch electrode 2 in a different layer the touch signal lines 3 connected to the touch electrode 2, and making the orthographic projection of the touch signal lines 3 on the display substrate 1 overlap with the orthographic projection of the touch electrode 2 on the display substrate 1, on one hand, self-capacitance touch control of the touch electrode 2 can be implemented, and compared with the touch structure with a multilayer touch electrode design based on the mutual-capacitance touch principle, the touch electrode 2 of self-capacitance touch control has a smaller area, so that the loads of the touch electrode 2 and the touch signal lines 3 are reduced, and the driving requirements thereof by the touch driver chip are satisfied. On the other hand, compared with the touch structure with a single-layer touch electrode design based on the self-capacitance touch principle, the touch signal lines 3 do not occupy any region of in a plane where the touch electrode 2 is located, namely, the plane where the touch electrode 2 is located is completely occupied by the touch electrode 2 capable of implementing touch positioning, without any region incapable of touch positioning. That is, there is no touch blind region caused by the arrangement of the touch signal lines 3 in the plane where the touch electrode 2 is located, thereby eliminating the influence of the touch blind region on touch operations, and improving sensitivity, linearity and accuracy of touch operations on the display panel. The display panel can not only satisfy the requirements of the touch driver chip on the touch load, but also avoid the touch blind region caused by the arrangement of the touch signal lines 3. Therefore, the display panel may be not only a small-sized touch display panel, but also a large-sized touch display panel.

In some implementations, the display panel further includes a first insulation layer 4 between the touch signal lines 3 and the touch electrode 2. At least one first via 5 is opened in the first insulation layer 4 in a region corresponding to each of the touch units 21, and the touch unit 21 is connected to the touch signal line 3, which is configured to provide signals for the touch unit, through the first via 5. The touch signal lines 3 can transmit touch driving signals from the touch driver chip to the touch electrode 2.

Figure 10:
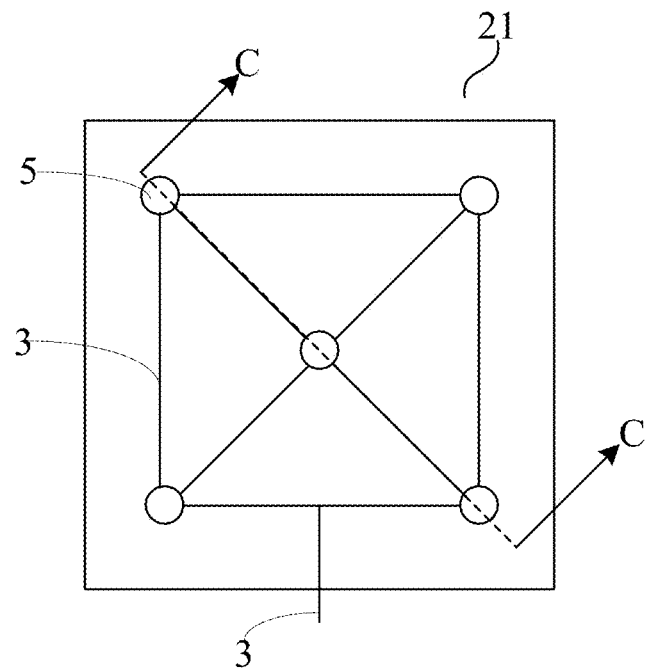
FIG. 10 is a schematic structural top view showing an arrangement of first vias in a first insulation layer corresponding to the touch units in a display panel according to an embodiment of the present disclosure.
Figure 11:
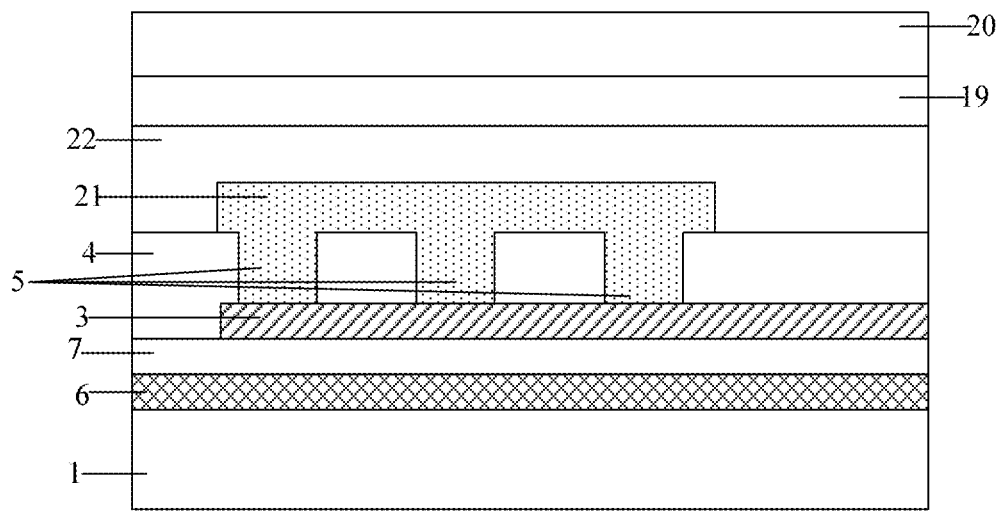
FIG. 11 is a schematic structural cross-sectional view of FIG. 10 taken along line CC.

In some implementations, as shown in FIGS. 10 to 11, a plurality of first vias 5 are opened in the first insulation layer 4 in a region corresponding to each of the touch units 21. The plurality of first vias 5 are uniformly distributed and connected to each other through the touch signal lines 3. With such arrangement, on one hand, an impedance of the touch signal lines 3 can be reduced, thereby reducing resistance-capacitance delay of the touch units 21, and improving touch performance of the touch electrode. On the other hand, the touch units 21 are connected to the corresponding touch signal lines 3 through the plurality of first vias 5, so that the risk of failing to connect the touch units 21 with the touch signal lines 3 through certain first via 5 in the process can be reduced, thereby ensuring reliable connection between the touch units 21 and the corresponding touch signal lines 3, as well as good touch performance of the touch electrode.

In some implementations, as shown in FIG. 3, one first via 5 is opened in the first insulation layer 4 in a region corresponding to each of the touch units 21. For a column of touch units 21, along a direction from top to bottom, and first vias 5 corresponding to the touch units 21 are sequentially arranged from an upper right corner of the touch units 21 to a lower left corner of the touch units 21. With such arrangement, the requirements of the touch driver chip on the touch load of the touch electrode 2 can be satisfied, and the touch blind region caused by the arrangement of the touch signal lines 3 can be avoided.

In some implementations, in a row direction of the array of touch units 21, A touch units 21 are provided, each of the touch units 21 has a load value a, and $A*a \leq P$; and in a column direction of the array of touch units 21, B touch units 21 are provided, each of the touch units 21 has a load value b, and $B*b \leq P$; where P is a maximum load capacity of a touch driver chip for providing signals for the touch electrode. In some implementations, each touch unit 21 has a rectangular contour, and a size ranging from 3.5 mm*3.5 mm to 4.5 mm*4.5 mm. Such size range of the touch units 21 can ensure that neither a load value of each row of touch units 21 nor a load value of each column of touch units 21 exceeds the maximum load capacity of the touch driver chip, thereby satisfying the requirement for driving the touch electrode by the touch driver chip.

In some implementations, as shown in FIGS. 3 and 4, the display panel further includes a display region 101 and a bonding region 102. The touch electrode 2 and the shielding electrode 6 are located in the display region 101, and the touch signal lines 3 and the shielding signal lines 8 extend from the display region 101 to the bonding region 102. The bonding region 102 is provided with a lead electrode 9, a plurality of touch electrode bonding ends 11, and at least one shielding electrode bonding end 12. The touch electrode bonding ends 11 and the shielding electrode bonding ends 12 are disposed in the same layer as the touch electrode 2, and the lead electrode 9 is disposed in the same layer as the touch signal lines 3. The touch signal lines 3 are connected to the touch electrode bonding ends 11 through a second via 13 opened in the first insulation layer 4. The shielding signal lines 8 are connected to the lead electrode 9 through a third via 14 opened in the second insulation layer 7, and the lead electrode 9 is connected to the shielding electrode bonding ends 12 through a fourth via 15 opened in the first insulation layer 4. By providing the touch electrode bonding ends 11 and the shielding electrode bonding ends 12 in the bonding region 102, bonding connection of the touch units 21 and the shielding units 61 to a peripheral circuit 16 can be implemented, so that the touch driver chip in the peripheral circuit 16 can provide touch driving signals for the touch units 21 and the shielding units 61.

Figure 12:
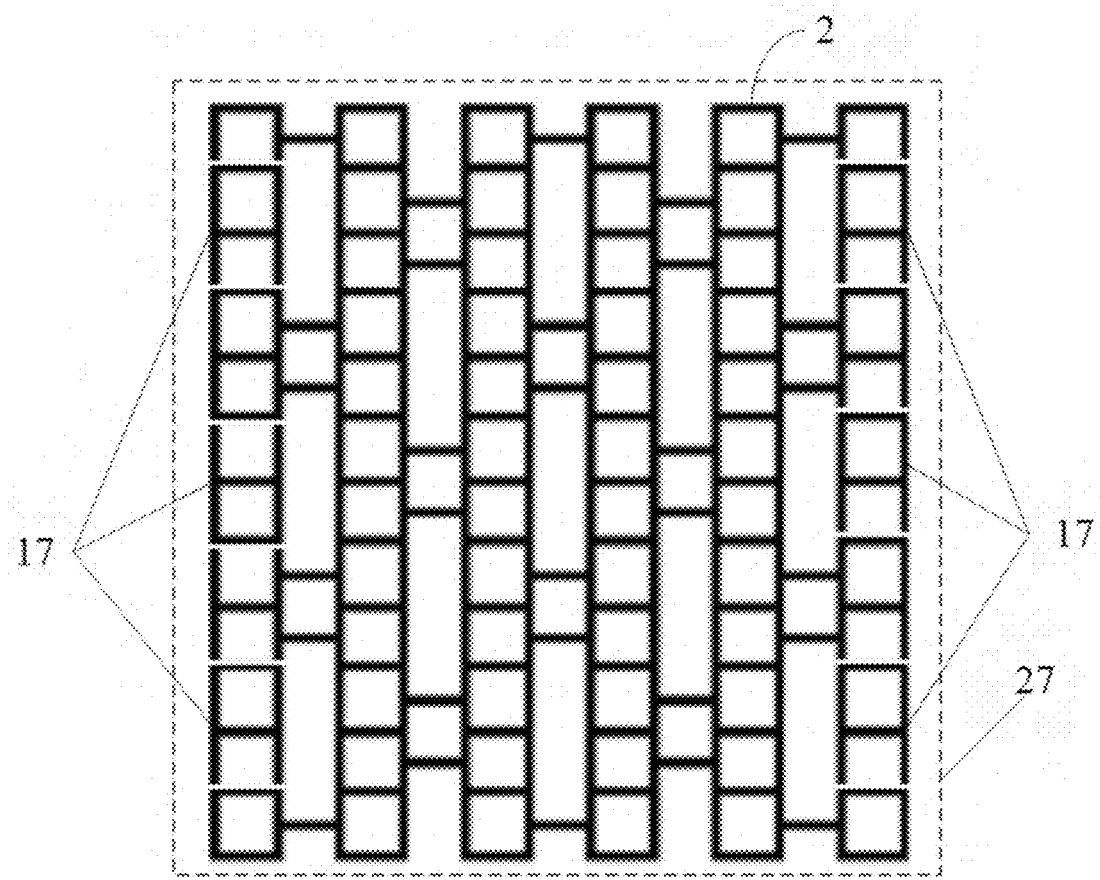
FIG. 12 is a schematic structural top view of floating electrodes in a display panel according to an embodiment of the present disclosure.

In some implementations, as shown in FIG. 12, the display panel further includes floating electrodes 17 distributed in a display region. The floating electrodes 17 are floating, and arranged in the same layer as the touch electrode 2, and an orthographic projection of the floating electrodes 17 on the display substrate does not overlap an orthographic projection of the touch electrode 2 on the display substrate. The floating electrodes 17 and the touch electrode 2 are disposed at different positions in the same layer, and the floating electrodes 17 are arranged in regions in which the touch electrode 2 is not located. With such arrangement, on one hand, since the floating electrodes 17 occupy some regions, the distribution area of the touch electrode 2 can be reduced while ensuring that the touch electrode 2 implements full-surface touch control on the display panel, thereby reducing the load of the touch electrode 2, facilitating driving for the touch electrode 2 by the touch driver chip, and improving sensitivity, linearity and accuracy of touch control. On the other hand, since the floating electrodes 17 and the touch electrode 2 are disposed in the same layer, when the touch electrode 2 is non-uniformly distributed on a display surface of the display panel and both the floating electrodes 17 and the touch electrode 2 are made of opaque metal materials, opaque regions of the display panel tends to be distributed uniformly when seen from a display side of the display panel, and there is substantially no visual distribution difference of opaque regions, thereby improving the visual effect of the display panel.

It should be noted that if the touch electrode 2 is uniformly distributed across the display surface of the display panel and the load of the touch electrode 2 can satisfy the driving requirements of the touch driver chip, the floating electrodes may be omitted.

In some implementations, the floating electrodes 17 are in a grid shape, and an orthographic projection of the floating electrodes 17 on the display substrate does not overlap the sub-pixels 10. With such arrangement, on one hand, it is ensured that the floating electrodes 17 have substantially the same distribution uniformity as the touch electrode 2, thereby improving the visual effect of the display panel at the display side. On the other hand, it is ensured that the floating electrodes 17 does not shield the sub-pixels 10, and thus does not affect the transmittance of the display panel.

In some implementations, the floating electrodes 17 are distributed in a region (e.g., a rectangular region 27) where the touch units 21 are located, with a ratio of distribution area less than 40%. That is, in the region where the touch units 21 are located, a ratio of an area of an orthographic projection of the floating electrodes 17 on the display substrate to an area of an orthographic projection of the touch units 21 on the display substrate is less than 40%. With such arrangement, an amount of touch signals of the touch units 21 is ensured, thereby improving the touch performance. In some particular application scenarios, such as a foldable display panel, a proportion of area of the floating electrodes 17 can be increased to improve flexibility.

In some implementations, as shown in FIG. 3, the display panel further includes a selection switch circuit 18 (not shown in FIG. 4) in the bonding region 102. The selection switch circuit 18 includes a plurality of input ends and a plurality of output ends. The input ends are connected to a peripheral circuit; and the plurality of output ends are respectively connected to the touch electrode bonding ends and the shielding electrode bonding ends. Since the touch electrode is based on a self-capacitance touch principle, a huge number of touch electrode lines are involved in a large-sized display panel. Therefore, a great number of leads appear in the bonding region 102, leading to an increased area of the bonding region 102 of the display panel. By introducing the great number of leads into the selection switch circuit 18, the selection switch circuit 18 can select and switch on or off the plurality of touch electrode lines, so that the number of touch electrode bonding ends, as well as the area of the bonding region 102 of the display panel, are reduced.

In some implementations, as shown in FIG. 4, the display panel further includes a polarizer 19 and a cover plate 20. The polarizer 19 and the cover plate 20 are sequentially superimposed on a side of the touch electrode 2 away from the display substrate 1, and a third insulation layer 22 is further provided between the polarizer 19 and the touch electrode 2. The polarizer 19 enables color display of the display panel. The cover plate 20 can protect the touch electrode 2.

Based on the above structure of the display panel, an embodiment of the present disclosure further provides a method for driving a display panel. The display panel includes a display substrate, and a touch electrode and a shielding electrode arranged on a display side of the display substrate. The shielding electrode and the touch electrode are sequentially arranged in a direction away from the display substrate; and an orthographic projection of the shielding electrode on the display substrate at least partially overlaps an orthographic projection of the touch electrode on the display substrate. The method for driving the display panel includes: providing a touch driving signal to the touch electrode, while keeping the shielding electrode floating; or, providing the same signal as the touch driving signal to the shielding electrode.

In some implementations, the touch driving signal is provided for the shielding electrode through shielding signal lines while providing the touch driving signal for the touch electrode. During touch control, the touch driver chip provides signals with the same magnitude as the touch driving signals to the shielding electrode, so that there is no voltage difference between the shielding electrode and the touch electrode, the capacitor formed by the shielding electrode and the touch electrode is not to be charged, and thus the touch electrode has the minimum capacitive load and thus the least requirement on the touch driver chip. Meanwhile, the shielding electrode can better shield the display noises of the display substrate, so that the display noises are prevented from being coupled to the touch electrode lines, thereby avoiding interference of the display noises on the touch performance of the touch electrode.

Based on the above structure of the display panel, an embodiment of the present disclosure further provides a method for manufacturing the display panel, including the following steps S1 to S2.

At step S1, preparing a display substrate. At step S2, sequentially preparing a shielding electrode and a touch electrode on a display side of the display substrate. An orthographic projection of the shielding electrode on the display substrate at least partially overlaps an orthographic projection of the touch electrode on the display substrate.

In some implementations, the shielding electrode and the touch electrode are prepared on the basis of completing the preparation process of the display substrate, and the specific process steps includes the following steps S21 to S28.

At step S21, forming a shielding electrode film layer by magnetron sputtering.

At step S22, forming a pattern including a shielding electrode and shielding signal lines by exposure and etching.

At step S23, forming a second insulation layer by chemical vapor deposition; and dry etching the second insulation layer at a corresponding position in the bonding region to form a third via.

At step S24, forming a touch signal line film layer by magnetron sputtering.

At step S25, forming a pattern including touch signal lines and a lead electrode by exposure and etching.

At step S26, forming a first insulation layer by chemical vapor deposition; dry etching the first insulation layer at a corresponding position in the display region to form a first via; and dry etching the first insulation layer at a corresponding position in the bonding region to form a second via and a fourth via.

At step S27, forming a touch electrode film layer by magnetron sputtering.

At step S28, forming a pattern including a touch electrode, floating electrodes, touch electrode bonding ends and shielding electrode bonding ends by exposure and etching.

In some implementations, the method for manufacturing the display panel further includes the following steps S3 to S4.

At step S3, forming a third insulation layer by chemical vapor deposition. At step S4, attaching a polarizer and a cover plate to the third insulation layer.

All film layers in the display panel are prepared by conventional processes, which are not described in detail here.

In the display panel provided in the embodiment of the present disclosure, by providing the shielding electrode between the display substrate and the touch electrode, display noises of the display substrate can be shielded, thereby reducing and avoiding interference of coupling effect of the display noise on touch operations of the touch electrode, and thus improving the touch performance of the display panel. In addition, by providing the touch electrode in a different layer from the touch signal lines connected to the touch electrode, and making that the orthographic projection of the touch signal lines on the display substrate overlap the orthographic projection of the touch electrode on the display substrate, on one hand, self-capacitance touch control of the touch electrode can be implemented, and compared with the touch structure with a multilayer touch electrode design based on the mutual-capacitance touch principle, the touch electrode of self-capacitance touch control has a smaller area, so that the loads of the touch electrode and the touch signal lines are reduced, and the driving requirements of the touch driver chip are satisfied. On the other hand, compared with the touch structure with a single-layer touch electrode design based on the self-capacitance touch principle, the touch signal lines do not occupy any region in a plane where the touch electrode is located, and there is no touch blind region caused by the arrangement of the touch signal lines in the plane where the touch electrode is located, thereby eliminating the influence of the touch blind region on touch operations, and improving sensitivity, linearity and accuracy of touch operations on the display panel. The display panel can not only satisfy the requirements of the touch driver chip on the touch load, but also avoid the touch blind region caused by the arrangement of the touch signal lines. Therefore, the display panel may be not only a small-sized touch display panel, but also a large-sized touch display panel.

An embodiment of the present disclosure further provides a display apparatus including the display panel according to the above embodiment.

By adopting the display panel in the above embodiment, display noises of the display substrate in the display panel can be shielded, thereby improving the touch performance of the display apparatus. Meanwhile, the display apparatus can not only satisfy the requirements of the touch driver chip on the touch load, but also avoid the touch blind region, so that the display apparatus may be not only a small-sized touch display apparatus, but also a large-sized touch display apparatus.

The display apparatus provided in the embodiment of the present disclosure may be any product or component with a display function, such as an OLED panel, an OLED television, a monitor, a mobile phone, a navigator, or the like.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display panel, comprising a display substrate; and
a touch electrode and a shielding electrode arranged on the display substrate; wherein the shielding electrode and the touch electrode are sequentially arranged in a direction away from the display substrate; and
an orthographic projection of the shielding electrode on the display substrate at least partially overlaps an orthographic projection of the touch electrode on the display substrate,
wherein the shielding electrode comprises a plurality of shielding units spaced apart from each other, the plurality of shielding units are arranged in an array,
wherein in a row direction of the array of shielding units, M shielding units are provided, each of the shielding units has a load value x, and $M*x \leq P$; and
in a column direction of the array of shielding units, N shielding units are provided, each of the shielding units has a load value y, and $N*y \leq P$;
where P is a maximum load capacity of a driver chip for providing signals for the shielding electrode.

2. The display panel according to claim 1, wherein
the touch electrode comprises a plurality of touch units arranged in an array; and
in a row and/or column direction of the array of touch units, the shielding units correspond to the touch units in a one to one manner or in a one to many manner.

3. The display panel according to claim 2, wherein, in a row direction of the array of touch units, A touch units are provided, each of the touch units has a load value a, and $A*a \leq P$; and
in a column direction of the array of touch units, B touch units are provided, each of the touch units has a load value b, and $B*b \leq P$;
where P is a maximum load capacity of a touch driver chip for providing signals for the touch electrode.

4. The display panel according to claim 1, further comprising shielding signal lines arranged in the same layer as the shielding electrode; wherein each of the shielding units is individually connected to one of the shielding signal lines, and the shielding signal lines connected to one or more rows of shielding units are connected together to be connected into the driver chip.

5. The display panel according to claim 4, wherein the shielding signal lines comprise a first signal line and second signal lines, the first signal line surrounds a periphery of the array of shielding units, a part of the second signal lines are distributed at the periphery of the array of shielding units, and another part of the second signal lines are distributed in spaces between rows of the array of shielding units; and
the second signal lines are respectively and independently connected to the shielding units, and connected to the first signal line, and the first signal line is connected to the driver chip.

6. The display panel according to claim 4, wherein the display substrate comprises a plurality of sub-pixels arranged in an array; and
the shielding units are in a grid shape, and an orthographic projection of the shielding units on the display substrate does not overlap the sub-pixels; and an orthographic projection of the shielding signal lines on the display substrate does not overlap the sub-pixels.

7. The display panel according to claim 6, wherein the touch units are in a grid shape, and an orthographic projection of the touch units on the display substrate does not overlap the sub-pixels; and
a grid density of the shielding units is smaller than or equal to a grid density of the touch units;
and a grid density of the touch units is smaller than a distribution density of the sub-pixels.

8. The display panel according to claim 7, further comprising touch signal lines on a side of the shielding electrode away from the display substrate, and on a side of the touch electrode close to the display substrate; wherein
each of the touch units is individually connected to one of the touch signal lines; and an orthographic projection of the touch signal lines on the display substrate overlaps an orthographic projection of the touch electrode on the display substrate.

9. The display panel according to claim 8, further comprising a first insulation layer between the touch signal lines and the touch electrode; wherein
at least one first via is opened in the first insulation layer in a region corresponding to each of the touch units, and the touch unit is connected to the touch signal line configured to provide signals for the touch unit through the first via.

10. The display panel according to claim 9, wherein a plurality of first vias are opened in the first insulation layer in a region corresponding to each of the touch units; wherein the plurality of first vias are uniformly distributed and connected to each other through the touch signal lines.

11. The display panel according to claim 9, wherein one first via is opened in the first insulation layer in a region corresponding to each of the touch units; wherein
for a column of touch units, from top to bottom, first vias corresponding to the touch units are sequentially arranged from an upper right corner of the touch units to a lower left corner of the touch units.

12. The display panel according to claim 7, further comprising floating electrodes floating and disposed in the same layer as the touch electrode, an orthographic projection of the floating electrodes on the display substrate does not overlap an orthographic projection of the touch electrode on the display substrate.

13. The display panel according to claim 12, wherein the floating electrodes are in a grid shape, and an orthographic projection of the floating electrodes on the display substrate does not overlap the sub-pixels.

14. The display panel according to claim 13, wherein the floating electrodes are distributed in a region, where the touch units are located, with a ratio of distribution area less than 40%.

15. The display panel according to claim 1, wherein the shielding electrode and the touch electrode are configured to input a same signal during touching.

16. A display apparatus, comprising the display panel according to claim 1.

17. A display panel, comprising a display substrate; and
a touch electrode and a shielding electrode arranged on the display substrate; wherein the shielding electrode and the touch electrode are sequentially arranged in a direction away from the display substrate; and
an orthographic projection of the shielding electrode on the display substrate at least partially overlaps an orthographic projection of the touch electrode on the display substrate,
wherein the shielding electrode and the touch electrode are configured to input a same signal during touching.

18. A display panel, comprising a display substrate; and
a touch electrode and a shielding electrode arranged on the display substrate; wherein the shielding electrode and the touch electrode are sequentially arranged in a direction away from the display substrate; and
an orthographic projection of the shielding electrode on the display substrate at least partially overlaps an orthographic projection of the touch electrode on the display substrate,
wherein the touch electrode comprises a plurality of touch units arranged in an array, and
wherein in a row direction of the array of touch units, A touch units are provided, each of the touch units has a load value a, and $A*a \leq P$; and
in a column direction of the array of touch units, B touch units are provided, each of the touch units has a load value b, and $B*b \leq P$;
where P is a maximum load capacity of a touch driver chip for providing signals for the touch electrode.

* * * * *